United States Patent [19]

Brehm et al.

[11] Patent Number: 5,164,323
[45] Date of Patent: Nov. 17, 1992

[54] PROCESS FOR THE SURFACE TREATMENT OF SEMICONDUCTOR SLICES

[75] Inventors: Gerhard Brehm, Haiming, Fed. Rep. of Germany; Helene Prigge, Chatswood, Australia; Reinhold Wahlich, Burghausen, Fed. Rep. of Germany

[73] Assignee: Wacker-Chemitronic Gesellschaft fur Elektronik-Grundstoffe mbH, Burghausen, Fed. Rep. of Germany

[21] Appl. No.: 581,274

[22] Filed: Sep. 12, 1990

[30] Foreign Application Priority Data

Oct. 12, 1989 [DE] Fed. Rep. of Germany ....... 3934140

[51] Int. Cl.⁵ .......................................... H01L 21/304
[52] U.S. Cl. ....................................... 437/10; 437/11; 51/281 SF
[58] Field of Search ................. 437/10, 11; 51/131.4, 51/281 SF

[56] References Cited

U.S. PATENT DOCUMENTS

| | | | |
|---|---|---|---|
| 3,905,162 | 9/1975 | Lawrence et al. | 437/10 |
| 4,042,419 | 8/1977 | Heinke et al. | 437/10 |
| 4,081,928 | 4/1978 | Kinnebrew et al. | 51/131.4 |
| 4,132,037 | 1/1979 | Bonora | 51/131.4 |
| 4,539,050 | 9/1985 | Kramler et al. | 437/11 |
| 4,587,771 | 5/1986 | Buchner et al. | 51/281 SF |

Primary Examiner—Mary Wilczewski
Attorney, Agent, or Firm—Collard & Roe

[57] ABSTRACT

Semiconductor slices, in particular having the surface polished on both sides, can be provided with a surface which effects the formation of gettering centers. These centers include stacking faults and/or dislocation networks in subsequent thermal treatment steps by a pressure loading being exerted on them with the aid of an elastic pressure transmission medium which causes local pressure inhomogeneities. A material erosion, for example in the form of scratches, is not necessary in this process. Advantageously, the treatment is carried out during a template polishing step in which a suitable pressure transmission medium is in contact with the rear side of the slice. The process makes available semiconductor slices with gettering action on one side which have a high surface quality on both sides.

6 Claims, No Drawings

PROCESS FOR THE SURFACE TREATMENT OF SEMICONDUCTOR SLICES

BACKGROUND OF THE INVENTION

1. Field of the Invention

The invention relates to a process for the surface treatment of semiconductor slices which effects, during a subsequent thermal treatment, the formation of centers with gettering capability by generating a mechanical stress field in at least one slice surface, and also relates to semiconductor slices polished on both sides obtainable thereby.

2. The Prior Art

In the production of electronic components made from semiconductor slices, the requirements imposed on the quality of the material used are constantly increasing due to the increasing integration density. In this connection, great importance is attached to an as fault-free, perfect crystal structure as possible. This applies, in particular, to the surface layer, which is relatively thin compared with the total slice thickness, on the front of the slice in which the actual construction of the circuits proceeds in the individual process steps. The point defects and/or agglomerations of point defects causing losses in yield have to be removed from this layer as completely as possible. For this purpose, the concept of rear-side gettering in which the point defects are extracted via the rear side of the slice has been successful.

In this connection, stacking faults and/or dislocation networks produced in the rear-side region in the interior of the slice are ultimately effective as gettering centers. For an optimum gettering action, these centers must not anneal out as a result of the various thermal processes at the manufacturing plant producing the component. They must not grow to the front side of the slice and they must not be removed by oxidation in the various oxidation steps either. Both for the stacking faults and also for the dislocation networks, the depth reached in each case ultimately depends on the processes carried out at the manufacturing plant producing the component.

In order to achieve a gettering action at the rear side of the slice, the latter is usually provided either with a coating composed of polycrystalline material or with a controlled surface destruction, usually known in technical language as "damage". Various "damage" methods are known. For example, damage methods include mechanical treatment processes associated with more or less severe material removal. In these damage processes the rear side of the slice is roughened by means of styli or sand jets (see U.S. Pat. No. 3,905,162), by means of a bath of fluidized abrasive grains (see German Offenlegungsschrift 2,927,220) or by means of moving carrier bodies having an elastic coating with abrasive grains bound therein (see German Offenlegungsschrift 3,148,957 or the corresponding U.S. Pat. No. 4,587,771) and thereby acquires a gettering action. A similar result can also be achieved with the method of the so-called "wet blasting" in which a pressurized water/abrasive grain spray jet acts on the rear side of the slice. The usually at least slightly roughened rear sides of the slices generated with these known processes may, however, result in an increased liberation of particles. These particles move to the opposite smooth surfaces during the processing steps at the manufacturing plant producing the component, which particles may reduce the yields of satisfactory components ultimately achieved.

The method of partially melting surface regions by means of a laser beam to generate a gettering rear side according to German Offenlegungsschrift 3,246,480 or the corresponding U.S. Pat. No. 4,539,050 is restricted to slices having a particular fine surface structure and can therefore be used only in specific cases.

Finally, German Offenlegungsschrift 2,537,464 or the corresponding U.S. Pat. No. 4,042,419 mentions, in addition to the possibility of generating a gettering action on the rear side by a slight grinding action, also discloses a method in which dopants are incorporated in the host lattice of the semiconductor up to their solubility limit at high temperatures. During the subsequent quenching to low temperatures, the dopant concentration exceeds this limiting value. This results in deformations and in the production of mismatched dislocations. In a subsequent polishing step, the damaged layer is then removed from the front side of the slice. This method is, however, time-consuming and, due to the high concentration of dopants present, is always associated with the risk of the contamination of the front side of the slice and/or of the apparatus used in the component production.

SUMMARY OF THE INVENTION

It is an object of the invention to provide a process which can easily be carried out and which makes possible high throughputs and by which gettering surfaces can be generated on the semiconductor slices. These gettering surfaces are notable for low particle production during the subsequent processing steps comprising the component manufacture and do not cause any contamination. This process is capable of being used, in particular, in the case of semiconductor slices polished on both sides.

The object is achieved by a process which comprises subjecting at least one slice surface to a pressure loading by erosion-free exposure to an elastic pressure transmission medium which causes local pressure inhomogeneities.

Surprisingly, it was found that, in the corresponding subsequent thermal process steps (for example, annealing for at least 30 minutes at 900° C.–1200° C. in an oxygen atmosphere), semiconductor slices pretreated in this manner form centers with gettering capability such as stacking faults and/or dislocation networks which then develop the desired gettering action. When the treated surface of slices polished on both sides are examined in collimated light, no scratches or other signs of corrosion of any kind can be identified under these circumstances. The local surface deformations caused by the process reveal themselves under the microscope only at the most as flat imprints or pressure marks.

Suitable pressure transmission media for the process according to the invention are sheets made of elastic materials. These materials have the property that they transmit a uniform pressure applied to one of their surfaces via the surface situated opposite in each case with locally varying intensity to a flat surface in contact therewith. It has proved to be advantageous if these local pressure differences are distributed as uniformly as possible over the surface acting on the semiconductor slice. Since pressure gradients or pressure inhomogeneities have been found to be effective even in the microscopic range, a quantitative specification of the pressures ultimately acting on an element of area of the surface of the semiconductor slice treated in each case is not possible for metrological reasons alone. Hence, the uniform pressure applied to the transmission medium is therefore specified. This is typically in the range of up to about 2 bar; and preferably it is between 0.1 to 0.5 bar, based upon in each case the area of the treated semiconductor slice. In principle, the pressures may, however, be increased up to the upper limit at which the semiconductor materials, which are as a rule brittle and pressure-sensitive, begin to form cracks or to fracture.

Suitable starting materials are generally those elastic substances, i.e. extendable and compressible resilient materials, which have the tendency to counteract deformations occurring under the action of deforming forces, to which the property of transmitting pressures with local inhomogeneities can be imparted by appropriate production or treatment. In this connection, materials having a shore A hardness of about 15 to a shore D hardness of about 70 have proven successful. Examples are, for instance, plastics based on polyvinyl chloride, polyurethane, polyacrylate or fluorinated thermosetting plastics, natural or synthetic rubbers, for example based on silicone rubbers, or nonwoven-type or felt-type materials based on polyester, polypropylene plastics or polyethylene plastics.

In order to give these materials the necessary pressure transmission properties, those methods may be used which provide a limited number of points distributed over the surface having different elastic properties. For example, this is possible by thermal treatment such as local or specific incipient melting of regions which are advantageously distributed as regularly as possible over the surface. Another possibility is to generate a preferably uniformly distributed sequence of holes in the material for example by punching, drilling or piercing. In this case hole diameters in the range of up to approximately 5 mm have proved suitable. The use of materials whose spatial structure contains uniformly distributed, closed pores has also proved suitable and pore sizes of up to approximately 2 mm having proved particularly advantageous. The porosity of the materials may in that case be up to 90%. Suitable materials are also obtainable commercially and are used, for example, as imitation leather and the like. If necessary, the suitability can readily be established in preliminary experiments.

Preferably, plastic-based materials are used in which grains of a nonelastic material have been incorporated. Beneficially, grains of a different, and preferably a higher, hardness are used therefor. Specifically, they are used in such a manner that they are prevented from coming into contact with the slice to be treated. This manner of treatment is such that the risk of the production of scratches or other material corrosion is avoided. Desirably, the grain sizes are in the range of about 4-200 $\mu$m, which has proved to be particularly advantageous, on the one hand, for embedding the grains as completely as possible into the plastic and on the other hand, for the required inhomogeneous pressure transmission. Since the particles generating the deformation are bound in a matrix, it is usually even possible to dispense with a cleaning step subsequent to the pressure treatment of the semiconductor slices.

Those materials are useful which are unable to effect any impermissible contamination of the slices even in the case of a direct contact with the semiconductor slices to be treated. Selected as materials are those of different, in particular higher, hardness. Quartz particles, silicon particles or silicon carbide particles, and also those of aluminum oxide or zirconium oxide are therefore preferably used for treating silicon slices. In the case of gallium arsenide slices, in addition to those hard substances mentioned, particles or grains of, or example, gallium arsenide are also suitable. In the case of indium phosphide slices, for example, particles of indium phosphide are suitable. In the case of germanium slices, particles of germanium are suitable. Particles based on hard plastics can in principle also be used.

The preparation of the materials is desirably carried out in a manner such that a starting mixture is prepared from the starting materials. For example, the starting mixture can be a plastic which crosslinks at room temperature or at a higher temperature such as, for instance, silicone rubber. The starting material could be another plastic material previously mentioned above. The grain material is provided as an additive, and this mixture is then left to cure or set. Preferably, the plastic material and the grain or particulate material are in this case mixed in about equal parts by volume although mixtures with unequal proportions of about 1:10 to 10:1 can also be used. Examples of suitable silicone rubbers are those whose shore A hardness is at least approximately 15.

The materials can be converted into a form suitable for their use with the aid of processing methods known per se, for example by casting, rolling, spraying or pressing. The form of flat films having layer thicknesses of about 1 to 20 mm from which the shaped parts needed can then be, for example, cut or punched have proved best suited.

The actual treatment of the semiconductor slices which induces the formation of stacking faults can be carried out in a simple manner. Basically, any process is suitable for this purpose in which a sufficiently high pressure is caused to act on the semiconductor slice, which pressure is transmitted to that slice surface which constitutes the rear side of the slice. For example, the pressure may act through one of the transmission media capable of causing the pressure inhomogeneities on the back side. This pressure is absorbed on the front side of the slice with the aid of an as homogeneous a medium as possible which avoids pressure inhomogeneities. In principle, a procedure is even possible in which the front side and rear side of the slice are in contact during the pressure treatment with a pressure transmission medium which causes pressure inhomogeneities. In this case, however, the deformation produced must be removed again after the treatment from one side of the slice, the future front side, for example by erosion, or for example by etching or advantageously in a one-sided polishing process.

The necessary pressure, which is preferably in the range from 0.1 to 0.5 bar, can be generated with the aid of known apparatus, for example, from polishing processes and are suitable for exerting pressures of known intensity. For example, pneumatic or, advantageously, hydraulic pistons or pressure cylinders are suitable. The generation of pressure by loading with weights is also possible. In principle, it is possible to work with two pressure sources directed against each other in the process. Although it is sufficient as a rule if one side of the slice to be treated faces a base which only absorbs the pressure, the pressure transmission medium which effects pressure inhomogeneities can be applied under these circumstances between the pressure source and the slice. The medium which transmits the pressure uniformly and homogeneously even in the microscopic range is applied between the slice and the base. In principle, however, it is also possible to work with interchanged transmission media, stacking faults then being induced on the side of the slice facing the base.

The necessary time duration for the applied pressure action ranges from 1 sec to 10 min. It has been found that, with a longer duration of the applied pressure, just as also with a higher intensity of the applied pressure, that the number of stacking faults detected in the substrate increases after suitable thermal treatment. If only a small number of stacking faults is required, even a short pressure application onto the semiconductor slice may, on the other hand, be sufficient.

The process is desirably carried out in a manner such that the pressure always acts simultaneously on the entire slice surface, if only to minimize the risk of fracturing the expensive slices. Since at most a negligible relative movement occurs under these circumstances between the slice to be treated and the pressure transmission medium effecting pressure inhomogeneities, the risk is also low that an erosive interaction occurs between slice and medium.

In one particular embodiment of the process according to the invention, a type of piston is provided whose pressure surface is coated with pressure transmission medium effecting pressure inhomogeneities. The semiconductor slices to be treated are cyclically placed on a base, situated beneath this piston, with a medium homogeneously transmitting pressures, pressed and removed again.

The treatment according to the invention which induces the formation of stacking faults in thermal processes can be carried out as part of the production process of semiconductor slices in a separate substep. For example, this treatment may occur before polishing or desirably as an intermediate step between the substeps of the polishing process such as the erosive polishing and the polishing which removes any haze which may remain.

Preferably, this treatment step is, however, integrated into a substep of the polishing process. Excellently suitable for this purpose is the so-called "template polishing" carried out, in particular, in the case of double-sided polishing frequently as a concluding step for removing residual haze from the slice surface. This process is described, for example, in U.S. Pat. No. 4,132,037. In this patent, the front side of the slice lies on the polishing cloth, while its rear side is situated in the cutouts of the template. A direct rear side of slice/template contact is avoided by means of elastic inserts which are as a rule about 100 to 1,000 μm thick. Normally, materials which transmit the pressure exerted during the polishing process as uniformly and homogeneously as possible are used for these inserts.

Surprisingly, it has been found that, if a material causing local pressure inhomogeneities is used for the inserts, the polishing step can be carried out in the usual manner with the usual process parameters without impairing the result. Simultaneously, the treatment which induces the formation of gettering centers such as, for example, stacking faults proceeds on the rear side of the slice. Semiconductor slices can consequently be polished to be haze free on the front side and to be provided with gettering action on the rear side in one process step. In most cases, the subsequent cleaning step necessary in the conventional "damage" processes associated with material erosion is not necessary either, since no erosive interaction occurs between the slice and the inserts.

In the case of template polishing, the stacking fault density can be influenced by the choice of the basic material used for the inserts and also by the polishing time, the polishing pressure and the rotary speed. An increase in the last-mentioned parameters as a rule also results in an increase in the stacking faults.

If possible, the inserts are used in the above-mentioned, normal-process layer thickness, although thicker inserts may also occasionally find use for material reasons. Desirably, the process parameters which are suitable in each case are determined and possibly optimized in preliminary experiments.

A process is consequently available with which semiconductor slices having high surface quality on both sides, such as, for instance, slices polished on both sides, can be provided with a surface having gettering action. This results without there being any appreciable impairment of the quality of this surface. Semiconductor slices obtained by the process according to the invention and polished on both sides have, as already explained, at most slight imprints. These slight imprints can be recognized under the microscope, on the gettering surface, that is to say the rear side of the slice. The microroughness of both surfaces, which can be inspected, for example, in collimated light or by measuring the scattered light originating from the irradiation spot on irradiating with a laser beam incident at an angle, remains virtually unchanged in the treatment.

The above objects are accomplished in accordance with the present invention by providing a process for the surface treatment of a semiconductor slice having a front surface and a back surface comprising providing an elastic pressure transmission medium; subjecting at least one of the front surface or the back surface of the slice to a pressure loading by erosion-free exposure to the elastic pressure transmission medium which causes local pressure inhomogeneities in the slice surface. Subsequent thermal treatment of the semiconductor slice causes the formation of stacking faults due to the mechanical stress field generated in the at least one slice surface.

The process is suitable, in particular, for use for silicon slices, but also for other elemental or compound semiconductors such as germanium, gallium arsenide or indium phosphide.

The present invention will now be further disclosed by reference to the following examples which are supplied solely for the purpose of illustration and are not intended as defining the limits and scope of the present invention.

Example 1

Several silicon slices polished on both sides (diameter of each slice approximately 15 cm) were subjected to different pressures for various times in a commercially available template polishing system. A commercially available polishing cloth based on polyurethane with a finely porous poromeric structure served as the base on which the front side of the slice rested during this treatment.

A layer about 10 mm thick of a previously prepared material based on silicone rubber was inserted between the template, which was linked to a pressure piston, and the rear side of the slice as pressure transmission medium. This material had been obtained by carefully mixing equal parts of silicone rubber and silicon carbide (grain size between 11 and 20 μm), casting and subsequently curing. The insert appeared homogeneous at the surface on visual inspection.

Each of the two slice surfaces was then examined microscopically and in collimated light for any damage. They proved to be completely smooth and free of scratches, flat imprints revealing themselves on some of the rear sides of the slices.

Two slices were then subjected to a stacking fault test by heating at 1,100° C. for 120 minutes in a moist oxygen atmosphere, subsequent etching in Sirtl etch and counting the etch pits per cm$^2$ under a microscope. The results are summarized below:

| Slice | Pressure (bar sp.) | Time (sec) | Stacking faults per cm$^2$ |
| --- | --- | --- | --- |
| 1 | 0.4 | 5 | 2,000–5,000 |
| 2 | 0.3 | 20 | 1,000–3,000 |

The front sides of the slice proved to be free of stacking faults, which were only possible to detect solely on the rear side of the slices.

Example 2

A group of 12 silicon slices polished on both sides (diameter approximately 15 cm) was subjected to a final haze-free polishing step in a template polishing system. For this purpose they were inserted into the cutouts of the template provided for receiving them. Approximately 500 μm thick layers of finely porous polyester/polyurethane film were provided in each case as the insert and consequently as the pressure transmission medium, in which film a uniform hole structure (hole diameter approximately 2 mm, approximately 4 holes per cm$^2$) was provided. A commercially available cloth made of finely porous poromeric polyurethane was used as polishing cloth.

After loading the machine, the polishing process was run for 3 minutes at 0.3 bar specific pressure, 40 rev/min and 35° C. polishing temperature. During polishing, a standard polishing agent (SiO$_2$ base, aqueous alkaline solution) was fed in.

The slices were then removed, rinsed and dried. On examination with the aid of the examination method according to German Offenlegungsschrift 3,637,477 (detection of the scattered light originating from the slice surface during laser irradiation), the front side proved to be haze-free. The roughness of the rear side had not altered compared with the previously polished state.

The slices were then subjected to a stacking fault test in a manner analogous to the procedure described in Example 1. All the front sides proved to be free of stacking faults. The stacking fault density of the rear sides of the slices was 1,000 to 5,000 stacking faults per cm$^2$.

Example 3

In a polishing run carried out in a manner analogous to Example 2, a polyester nonwoven fabric which had been superficially incipiently melted at points uniformly distributed over its surface (approximately 9 melted points per cm$^2$, diameter of the melted points approximately 1 mm) coming into contact with the slices was used as insert. In other respects, the same conditions were maintained.

In the case of the slices obtained by this embodiment of the process, the stacking fault density on the rear sides of the slices was about 8,000–15,000 per cm$^2$, while the front sides were completely perfect.

While only several embodiments of the present invention have been shown and described, it will be obvious to those of ordinary skill in the art that many modifications may be made to the present invention without departing from the spirit and scope thereof.

What is claimed is:

1. A process for the surface treatment of a semiconductor slice having a front surface and a back surface comprising:
    providing an elastic pressure transmission medium, which causes local pressure inhomogeneities;
    subjecting at least one of said front surface or back surface of said slice to a pressure loading by erosion-free exposure to said elastic pressure transmission medium;
    generating a mechanical stress field in said at least one slice surface by said local pressure inhomogeneities; and
    subsequently thermally treating said semiconductor slice, causing the formation of stacking faults in said at least one slice surface.

2. The process as claimed in claim 1, comprising applying a pressure of 0.1 to 0.5 bar for said pressure loading of said slice.

3. The process as claimed in claim 1, comprising maintaining the pressure loading for 1 sec to 10 minutes.

4. The process as claimed in claim 1, comprising providing a pressure transmission medium based on elastic plastics and having small regions, distributed over the surface, with different elastic properties.

5. The process as claimed in claim 1, wherein said pressure transmission medium comprises an elastic plastic having grains of a nonelastic material embedded therein.

6. The process as claimed in claim 1, further comprising a template polishing step during which the pressure loading is exerted.

* * * * *